United States Patent [19]
Nag et al.

[11] Patent Number: 5,392,003
[45] Date of Patent: Feb. 21, 1995

[54] WIDE TUNING RANGE OPERATIONAL TRANSCONDUCTANCE AMPLIFIERS

[75] Inventors: Manbir Nag, Plantation; Joseph P. Heck, Ft. Lauderdale, both of Fla.

[73] Assignee: Motorola, Inc., Schaumburg, Ill.

[21] Appl. No.: 103,655

[22] Filed: Aug. 9, 1993

[51] Int. Cl.$^6$ .............................................. H03F 3/45
[52] U.S. Cl. .................................. 330/254; 330/258; 330/300
[58] Field of Search ............... 330/252, 253, 254, 258, 330/300, 259

[56] References Cited

U.S. PATENT DOCUMENTS 4,823,092  4/1989  Pennock .............................. 330/253

OTHER PUBLICATIONS

IEEE Journal of Solid State Circuits, vol. SC-3., No. 4, "A New Wide-Band Amplifier Technique", pp. 353–365, Dec. 1968.

*Primary Examiner*—Steven Mottola
*Attorney, Agent, or Firm*—M. Mansour Ghomeshi

[57] ABSTRACT

A wide dynamic range Operational Transconductance Amplifier (OTA) (100) includes a differential voltage to current converter (206) for converting an input voltage to a current level. A pair of programmable folded cascodes (201) are coupled to the output of the converter (206) in order to render the amplifier (100) programmable. Current sources (222 and 226) are employed to provide output sourcing current. There is also included a common mode feedback (106) for maintaining the output signal substantially and equally centered between rails of the operating voltage (208).

12 Claims, 4 Drawing Sheets

WIDE TUNING RANGE OPERATIONAL TRANSCONDUCTANCE AMPLIFIERS

TECHNICAL FIELD

This invention is related in general to amplifiers and more particularly to operational transconductance amplifiers.

BACKGROUND

Signal filtering within a radio receiver is an essential part of signal processing to decode the transmitted information. Often, filtering is done by designing active filters based on LC ladder filters, as this topology is known to have very low sensitivity to errors in its component values. The main problem with trying to design LC filters today is that they are largely incompatible with present integration techniques. This is mainly because of the unintegratability of the inductor (L) component. It is known that an inductor can be simulated by an electronic component called a gyrator. Gyrators are made of transistors, bipolar or MOS or both, and a capacitor. All these components are fully compatible with today's integration technologies.

A further requirement of these signal filters is that they be programmable (tunable) in their bandwidth. A programmable bandwidth is achievable by varying the transconductance of the Operational Transconductance Amplifiers (OTAs) used in the design of gyrators. It is known that filter bandwidth is directly proportional to the OTA transconductance and inversely proportional to the capacitance. It is therefore desired to build an inductor with OTAs in silicon with a programmable transconductance.

Previously, designers were able to achieve programmability by using topologies with translinear stages. A detailed explanation of the workings of one such topology can be found in "A New Wide Band Amplifier Technique" by Barrie Gilbert which was published in the IEEE Journal of Solid State Circuits, vol. SC-3, #4, Dec. 1968.

As illustrated in the above mentioned paper, the translinear stage consists of a differential pair with an active current mirror. A problem with such a translinear stage is that a large number of devices contribute significant device noise to the overall circuit noise thereby increasing the noise floor. This significantly affects the dynamic range (DR), which is defined as the ratio of the maximum usable signal to the minimum usable signal (or noise floor plus distortion). Since supply voltages above 5V have been used in designing the circuits of the translinear stage, designers have been able to achieve an output swing of a few volts. This large voltage output swing allowed an acceptable dynamic range even though the noise floor was high. However, when the supply voltage drops significantly below 5 volt, a large portion of the output signal swing is lost. Depending on the supply voltage, this loss could be up to 65% of the output swing. Thus, the DR quantity severely decreases as a natural consequence.

It is therefore desired to have a programmable OTA that could operate at low supply voltages without a significant increase in the total noise floor.

SUMMARY OF THE INVENTION

Briefly, according to the invention, a wide dynamic range Operational Transconductance Amplifier (OTA) is disclosed. The amplifier includes a differential voltage to current converter for converting an input voltage to a current level. A pair of programmable folded cascodes are coupled to the output of the converter in order to render the amplifier programmable. Current sources are employed to provide output sourcing current. There is also included a means for maintaining the output signal substantially and equally centered between rails of the operating voltage.

In other aspects of the present invention, a programmable folded cascode is disclosed. The programmable folded cascode includes an amplifier for amplifying an input signal. A current device provides current sourcing or sinking for the amplifier. A programmable stage with minimum number of components coupled to the amplifier and the current device provides for the programming of the amplifier gain with minimum additional noise.

DETAILED DESCRIPTION OF THE PREFERRED EMBODIMENT

In designing an integrated inductor that could operate at very low supply voltages, a circuit is needed with a low noise floor. In order to accommodate this requirement, it is desirable to eliminate the 2nd stage translinear amplifier and yet maintain the inductor's programmability. This may be achieved by a programmable folded cascode. In accordance with the present invention, the concept of a programmable current mirror coupled with the fact that folded cascode circuits inherently provide better higher frequency response and precision, was used to design a folded cascode programmable current mirror. With this approach, the output stage was directly connected to this input stage rather than going through a voltage level translator.

Figure 2:
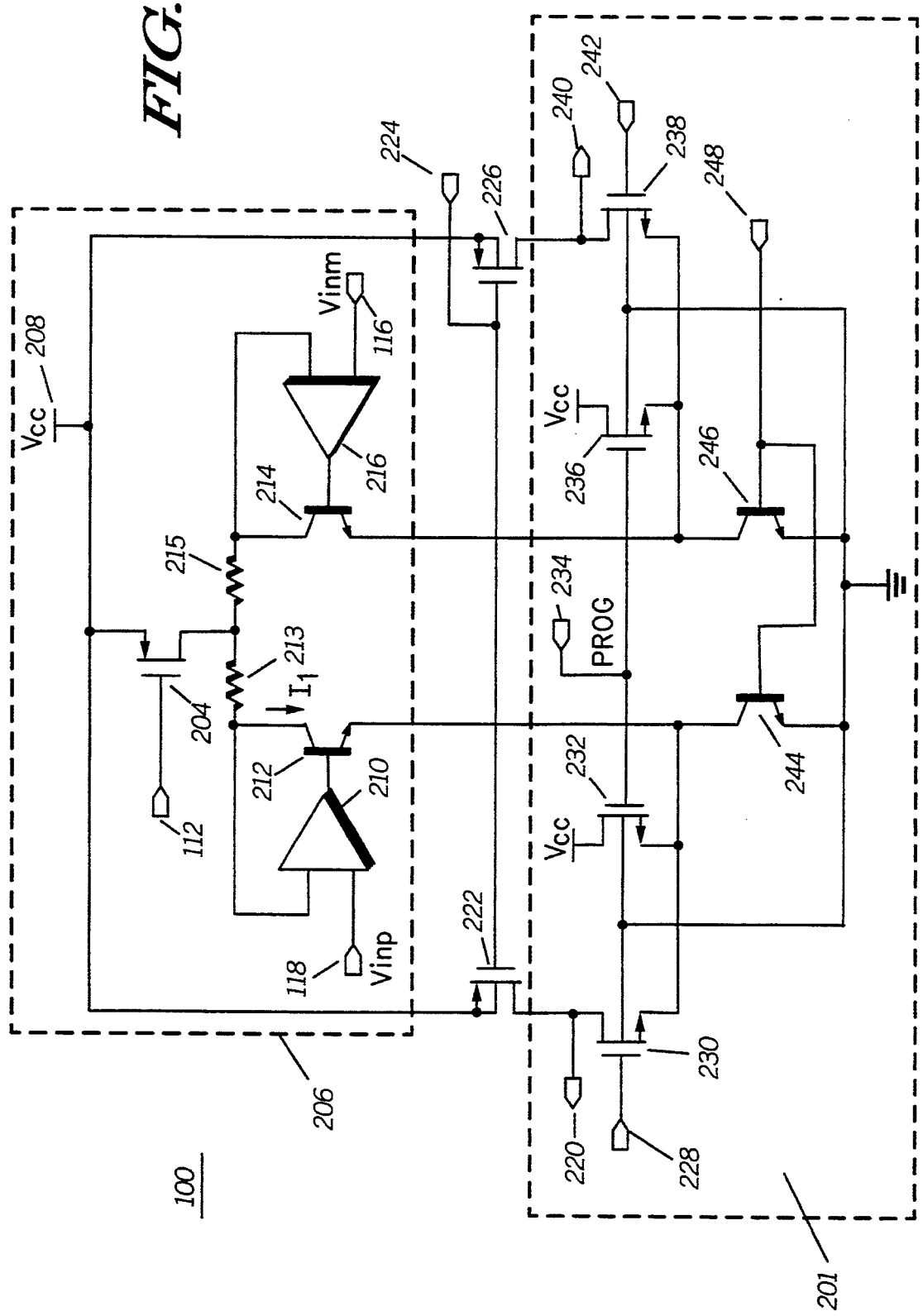
FIG. 2, shows detailed schematic diagram of an operational transconductance amplifier in accordance with the present invention.

The main advantage of this is that devices connected in the output stage FIG. 2 (230 and 238) are operated in common gate mode. This mode of operation provides for low input impedance and high output impedance. The latter is of principle advantage as it helps the OTA to be a more precise voltage to current converter.

Figure 1:
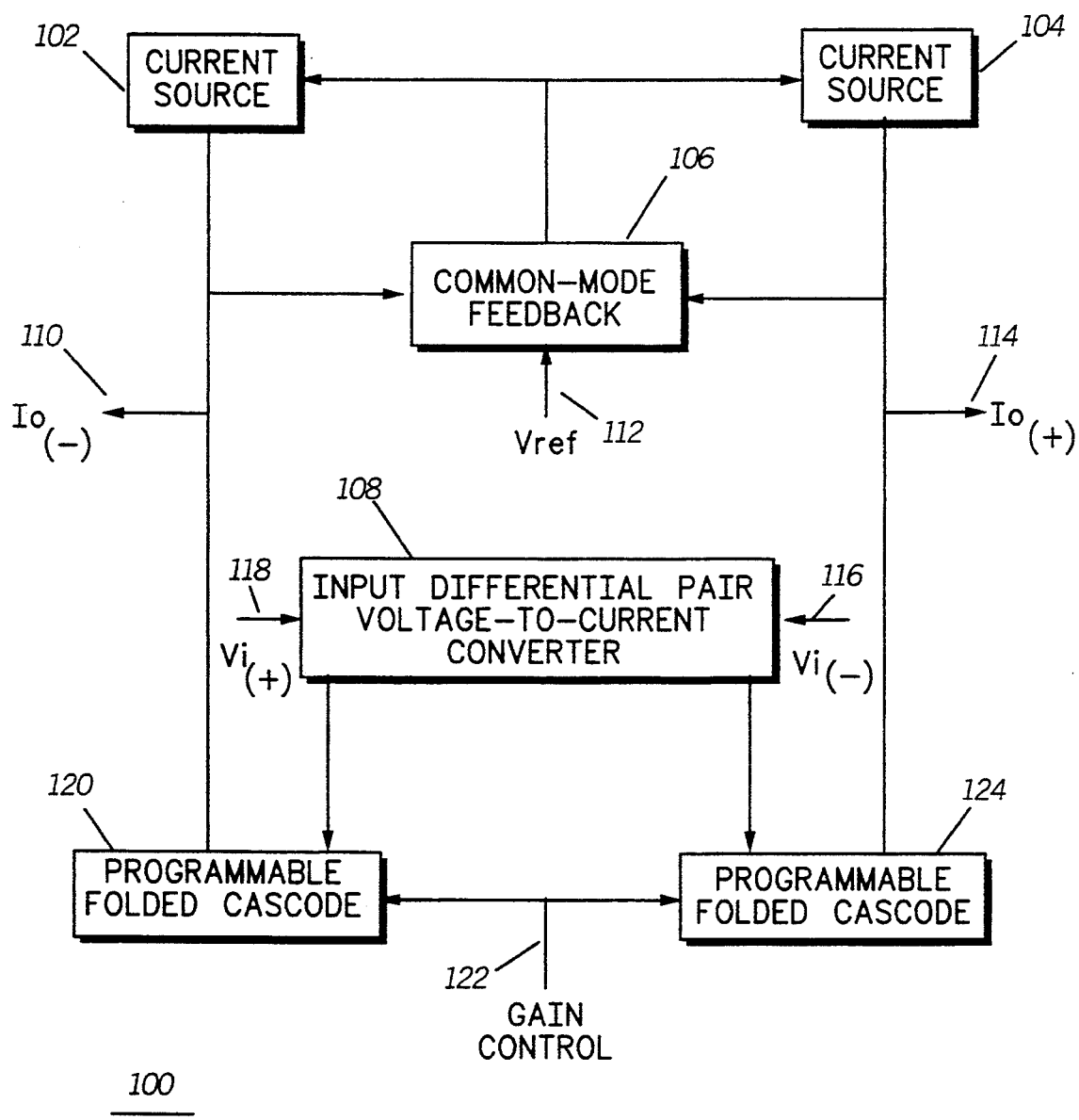
FIG. 1, shows a block diagram of a operational transconductance amplifier in accordance with the present invention.

Referring to FIG. 1, a block diagram 100 of an Operational Transconductance Amplifier (OTA) in accordance with the present invention is shown. The amplifier 100 includes two current sources 102 and 104. The two current sources share a common mode feedback signal circuit 106. A reference voltage $V_{ref}$ 112 is applied to the common mode circuit 106. At the center of the OTA 100 is an input differential voltage to current converter 108. The input to this block 108 are two voltages 118 and 116. The outputs of this differential converter are two currents that reflect the difference in the input voltages. The current outputs are fed to a programmable folded cascode circuit 120 and 124. As shown, the two programmable folded cascodes 120 and 124 share a gain control signal input $V_c$ 122. The outputs of the circuit 100 are output currents 110 and 114.

FIG. 2 shows the preferred embodiment schematic corresponding to the block diagram 100. The two differential inputs 118 and 116 are coupled to two Operational Amplifiers (OA) 210 and 216 which are configured in a unity gain mode. The OAs 210 and 216 preferably include low noise, large input swing devices. Indeed, in the preferred embodiment, they are constructed in such a way that their inputs can swing virtually from rail to rail. Furthermore, the OAs 210 and 216 are preferably MOS devices in order to achieve very high input impedance and very low gate current. The OAs 210 and 216 drive the bases of two transistors 212 and 214 whose differential collector currents are proportional to the differential input voltages 118 and 116. In order to increase the dynamic range of the circuit 100, the overall circuit noise must be minimized. This is accomplished by designing a low noise input stage operational amplifier, a single P channel current source and a negative feedback around the input operational amplifiers.

In order to ensure that the outputs stay biased at the proper voltage level (usually ½ the supply voltage), the common mode feedback signal is applied to the PMOS devices 222 and 226 in the complimentary output stage. The common mode signal 224 adjusts itself to the variations of the input signal thereby suitably controlling the PMOS drain current. It is noted that the source of the common mode signal 224 has not been elaborated in FIG. 2 for it is commonly known in the art.

The input ports 116 and 118 are differentially driven by the incoming signal. The two OAs 210 and 216 are unity gain operational amplifiers. From the concept of op amp virtual ground, the differential voltage between the two pairs of inputs of the op amps 210 and 216 is almost zero. Thus, the collector of transistors 212 and 214 follow the input driving signals 118 and 116, respectively. In other words, the driving signal is impressed on resistors 213 and 215. These resistors 213 and 215 play a principal role of setting the quiescent transconductance of the entire OTA circuit 100.

The transfer function of the input stage can be represented by the following equation:

$$I_{od} = 2V_{id}/R_{gm}$$

where $I_{od}$ represents the output differential current, [$I_{c1}$(transistor 212)−$I_{c2}$(transistor 214)]

$V_{id}$ represents the input differential voltage, [$V_{inp}$−$V_{inm}$]

$R_{gm}$ is the degeneration resistance (sum of 213 and 215)

The OAs 210 and 216 are capable of having their input swing go virtually all the way up to the supply rail and all the way to the ground rail. This is one of the necessary steps to maximize the circuit's dynamic range. The device 204 works as a current source. The amount of current which flows through it can set the maximum input swing that the entire circuit 100 can handle. In the preferred embodiment, this maximum input swing is 2V which is the product of 100 Kohms (resistance combination of 213 and 215) and 20 mA (current supplied by 204). The magnitude of the input stage current can be made proportional to supply voltage in order to maintain the maximum possible input swing over a range of supply voltage, $V_{cc}$ 208. The $V_{cc}$ 208 provides the operating voltage for the circuit 100. The combination of current source transistor 204 and output transistors 212, 214 plus the two OAs 210 and 216 constitute an input differential pair voltage to current converter in accordance with the present invention. The two output transistors 212 and 214 couple this converter to a pair of programmable differential folded cascodes 201.

The emitters of transistors 212 and 214 are connected to two current sinks 244 and 246, respectively. Also, connected to the emitter of 212 and 214, are amplifier transistors 230 and 238, respectively. Coupled to the amplifier transistors 230 and 238 are two differential programmable transistors 232 and 236 which add programmability to the folded cascodes in accordance with the present invention. The combination of these current devices 244 and 246, programmable devices 232 and 236, and amplifying devices 230 and 238 constitute a programmable differential folded cascode 201.

The operation of the folded cascode 201 is better understood by assuming for the moment that devices 232 and 236 are off. It can be seen that devices 230 and 238 form a non-programmable folded cascode stage. The bias current of transistor 212 is set equal to $I_1$, by transistor 204. The bias current of the transistor 244 would normally be set to twice $I_1$. This in turn sets the bias current of the transistor 230 equal to $I_1$. The folded cascode type of mirror has the benefit of good high frequency response since the output device is operated in the common-gate mode. It also provides a very high output impedance, which is needed for good performance of the filters which will be constructed from the OTA's. The output negative-going swing can be allowed to go to within a few tenths of a volt from ground, being constrained only by keeping the transistor 244 out of saturation and the transistor 230 in the normal pinch-off region of operation.

The folded cascode is made programmable by the addition of programming transistors 232 and 236. A programming input 234 is used in order to provide the control over these devices. As the gate voltage of the two transistors 232 and 236 is increased, these devices begin to turn on, stealing signal (and DC) current from the output devices 230 and 238. Two current sources 222 and 226 provide output sourcing current for the folded cascode 20 1 and eventually the circuit 100. The output stage is symmetric, as is the input stage, and is implemented using a push-pull methodology. The output stage is comprised of transistors 222 and 230 (and 226 and 238) which are preferably PMOS and NMOS devices, respectively. The sources of devices 230 and 238 are connected to the collectors of transistors 244 and 246. This type of an output stage is ideally suited to a very low voltage application because it obviates the need to include a second translinear stage, as done in the prior art.

The high output impedance makes the OTA look like a nearly perfect current source. Programmability is achieved by placing devices 232 and 236 in parallel with 230 and 238and by the fact that if one of the devices in parallel is driven harder than the other then the signal and DC current will choose the path of least resistance. The voltage that turns these parallel programming devices ON or OFF is controlled by an element outside the filter circuit such as a microprocessor or filter tuning circuit (master filter output in a master slave configuration). A minimal amount of distortion is created by the inclusion of these devices because they couple directly to the folded cascode structure via their sources. The noise added by two devices (to provide programming) is definitely much less than that added by a whole 2nd translinear stage. It should be noted that we have been able to achieve a 10:1 transconductance (hence overall filter bandwidth) change in our simulations.

The second translinear stage, used by the prior art, provides a suitable means to program OTA circuits by changing the tail current of the translinear differential pair. This is, however, accomplished at the additional cost of increasing the total circuit noise. This increase in noise is tolerable with a higher supply voltage since the available signal swing is greater. Obviously, this is not feasible with a very low voltage supply. Indeed, the dynamic range of the OTA would suffer with the noise added by the second translinear stage. It is noted that the range of the programming voltage is set by the physical dimensions of 232 and 236. If the W/L ratio is made large, then the programming voltage range will be reduced and vice-versa. The output stage devices have their drain current controlled by the common-mode feedback signal 224. This signal ensures that the PMOS current devices 226 and 222 drain the same amount of current as their NMOS counterparts 238 and 230 thereby ensuring symmetry of the output current source and sink capability.

Figure 3:
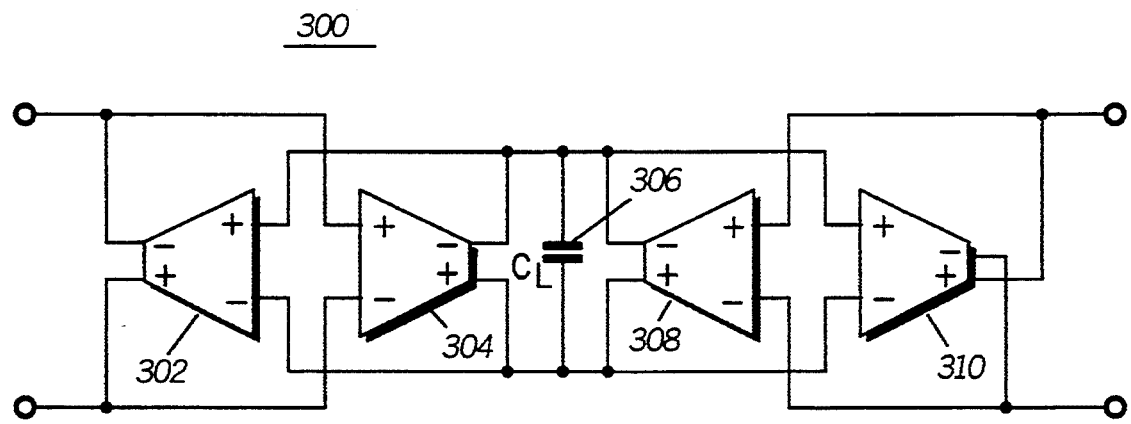
FIG. 3, shows a block diagram of a gyrator.

Referring to FIG. 3, a block diagram of a gyrator 300 in accordance with the present invention is shown. The gyrator 300 is a floating inductor and includes four OTAs 302, 304, 308, and 310 and a capacitor 306. The topology of the gyrator 300 is known in the art and therefore a detailed description is not necessary. The OTAs 302, 304, 308, and 310 are similar to the OTA shown and described in FIG. 2. It can be seen that the gyrator 300 may be integrated since all of its elements may be integrated using existing integration technologies. In addition, since the OTAs 302, 304, 308, and 310 are programmable so is the gyrator 300. It can be seen that the design of tunable LC filters is made significantly easier with the implementation of the programmable OTA 100.

Figure 4:
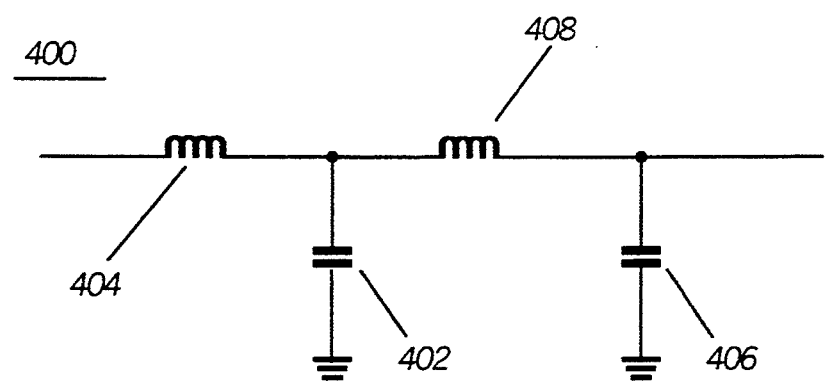
FIG. 4, shows a block diagram of a filter.

Referring now to FIG. 4, a tunable filter 400 comprising capacitors and inductors in accordance with the present invention is shown. The filter includes capacitors 402 and 406 and inductors 404 and 408. The inductors 404 and 408 may be realized using the gyrator 300 in accordance with the present invention. Since the gyrator 300 is programmable it can be seen that the inductors 404 and 408 are tunable as well. The tunability of the inductors 404 and 408 provide the filter 400 with a variable bandwidth.

Figure 5:
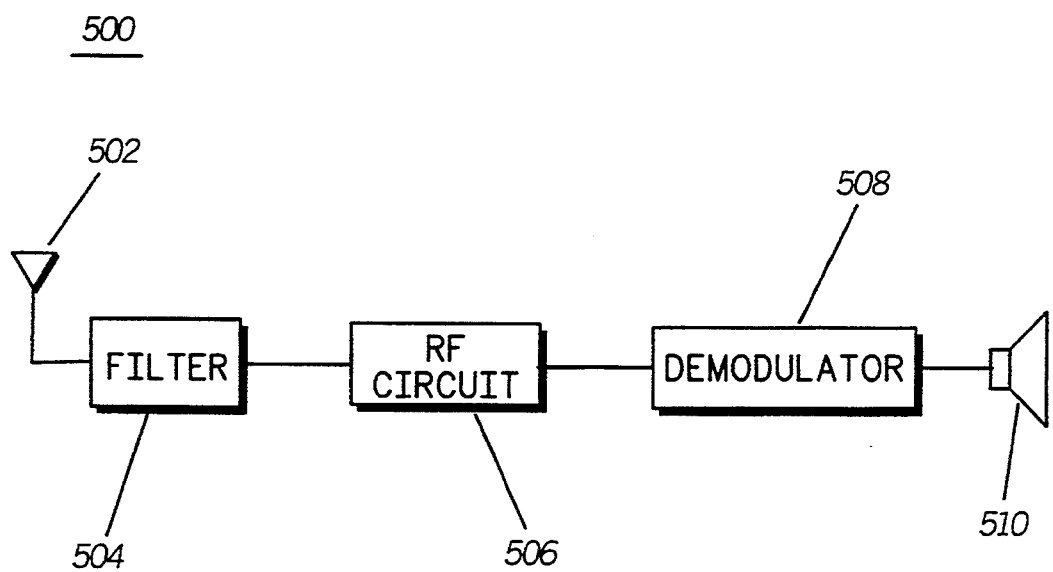
FIG. 5, shows a block diagram of a communication device in accordance of with the present invention.

Referring to FIG. 5, a block diagram of a communication device 500 is shown. The device 500 includes an antenna 502 where radio frequency signals are received. The signals are coupled to a filter 504 followed by RF circuits 506. The RF circuits 506 comprises the remaining RF components of the device 500. The radio frequency signal received at the block 506 are coupled to the demodulator 508 which demodulates the carrier to produce the information signal. This information signal is coupled to a speaker 510. The filter 504, includes at least one LC filter similar to the filter 400. This filter includes a variable bandwidth as previously described.

In summary, the principles of the present invention provide a method of attaining a very wide (at least 10:1) range of transconductance and a very low 1/f and flat-band noise level by using a combination of techniques—use of a fully differential configuration, use of low noise input stage op amps with virtually "rail-to-rail" input swing range configured in a unity gain mode to provide the input stage voltage-to-current conversion, and a gain-programmable folded cascode output stage. The low noise operation allows the circuit to be useful at low supply voltages. Another advantage of the folded cascode circuit is that no additional circuitry has been added to provide the tunability except for the programming devices.

It is understood that the embodiments presented in this specification are intended to provide a teaching of the principles of the present invention and not a limitation thereon. In particular, transistor devices employed in the OTA 100 represent components in accordance with the preferred embodiment. Other types of transistors may be used that would produce the same results.

What is claimed is:

1. A wide dynamic range tunable Operational Transconductance Amplifier (OTA) having an output and an operating voltage, comprising:
    a differential voltage to current converter, including:
        an output; at least one low noise large input swing amplifier; at least one current source coupled to the amplifier;
    a pair of programmable folded cascode stages each DC coupled to the output of the converter without utilizing additional coupling amplifiers, the folded cascode stages including:
        a common base amplifier:
        a programmable amplifier coupled to the common base amplifier for rendering the folded cascode stages programmable;
    means for maintaining the output signal substantially and equally centered between rails of the operating voltage; and
    a pair of current sources DC coupled to the pair of programmable folded cascode stages to provide variable output sourcing current.

2. An integrated low voltage wide dynamic range Operational Transconductance Amplifier (OTA), comprising:
    a differential voltage to current converter;
    a programmable differential folded cascode stage DC coupled to the differential voltage to current converter without additional coupling amplifiers, including:
        a differential amplifier stage having a gain;
        a differential current source coupled to the amplifier stage;
        a differential programmable stage coupled to the amplifier stage and the current source for programming the gain of the amplifier stage and
    a pair of current sources DC coupled to the programmable differential folded cascode stage.

3. The integrated low voltage wide dynamic range OTA of claim 2, further including means for maintaining the output signal substantially and equally centered between rails of the operating voltage.

4. The integrated low voltage wide dynamic range OTA of claim 2, further including a pair of current sources to provide output sourcing current.

5. The integrated low voltage wide dynamic range OTA of claim 2, wherein the differential programmable stage includes at least one transistor.

6. The integrated low voltage wide dynamic range OTA of claim 2, wherein the differential voltage to current converter comprises:
    an output;
    at least one low noise large input swing amplifier; and
    at least one current source coupled to the amplifier.

7. An integrated gyrator, comprising:
at least one Operational Transconductance Amplifier (OTA), comprising:
  a differential voltage to current converter;
  a programmable differential folded cascode stage DC coupled to the differential voltage to current converter without additional coupling amplifiers, including:
    a differential amplifier stage having a gain;
    a differential current source coupled to the amplifier stage;
    a differential programmable stage coupled to the amplifier stage and the current source for programming the gain of the amplifier stage and a pair of current sources DC coupled to the programmable differential folded cascode stage.

8. An integrated filter, comprising:
at least one gyrator operating on a low supply voltage, comprising: at least one OTA, comprising:
  a differential voltage to current converter;
  a programmable differential folded cascode stage DC coupled to the differential voltage to current converter without additional coupling amplifiers, including:
    a differential amplifier stage having a gain;
    a differential current source coupled to the amplifier stage;
    a differential programmable stage coupled to the amplifier stage and the current source for programming the gain of the amplifier stage and a pair of current sources DC coupled to the programmable differential folded cascode stage.

9. The integrated filter of claim 9, further including means for maintaining the output signal substantially and equally centered between rails of the operating voltage.

10. The integrated filter of claim 8, further including a pair of current sources to provide output sourcing current.

11. The integrated filter of claim 8, wherein the differential programmable stage includes at least one transistor.

12. A radio communication device, comprising:
a receiver for receiving radio frequency signal;
a variable bandwidth filter, comprising:
  at least one gyrator operating on a low supply voltage, comprising at least one OTA, comprising:
    a differential voltage to current converter;
    a programmable differential folded cascode stage DC coupled to the differential voltage to current converter without utilizing addition a coupling amplifiers, including:
      a differential amplifier stage having a gain;
      a differential current source coupled to the amplifier stage;
    a differential programmable stage coupled to the amplifier stage and the current source for programming the gain of the amplifier stage and
    a pair of current sources DC coupled to the programmable differential folded cascode stage;

* * * * *